(12) United States Patent
Komine

(10) Patent No.: US 9,128,388 B2
(45) Date of Patent: Sep. 8, 2015

(54) METHOD OF FOCUS MEASUREMENT, EXPOSURE APPARATUS, AND METHOD OF MANUFACTURING SEMICONDUCTOR DEVICE

(71) Applicant: Kabushiki Kaisha Toshiba, Minato-ku (JP)

(72) Inventor: Nobuhiro Komine, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 67 days.

(21) Appl. No.: 14/088,773

(22) Filed: Nov. 25, 2013

(65) Prior Publication Data
US 2014/0370719 A1    Dec. 18, 2014

(30) Foreign Application Priority Data
Jun. 13, 2013    (JP) .................................. 2013-124809

(51) Int. Cl.
  G03F 7/207    (2006.01)
  G03F 9/00    (2006.01)
  H01L 21/26    (2006.01)
  G03F 7/20    (2006.01)

(52) U.S. Cl.
  CPC .......... *G03F 9/7026* (2013.01); *G03F 7/70641* (2013.01); *G03F 9/7019* (2013.01); *H01L 21/26* (2013.01)

(58) Field of Classification Search
  CPC . G03F 7/70641; G03F 9/7019; G03F 9/7026; H01L 21/26
  USPC ...................................... 430/22, 30, 311, 394
  See application file for complete search history.

(56) References Cited

U.S. PATENT DOCUMENTS

| 5,300,786 | A | 4/1994 | Brunner et al. |
| 6,674,511 | B2 | 1/2004 | Nomura et al. |
| 6,967,719 | B2 | 11/2005 | Sato et al. |
| 7,678,513 | B2 | 3/2010 | Nomura |
| 8,023,759 | B2 | 9/2011 | Tawarayama |
| 8,085,393 | B2 | 12/2011 | Kasa et al. |
| 2009/0190118 | A1 | 7/2009 | Fukuhara |
| 2011/0300472 | A1 | 12/2011 | Komine et al. |

FOREIGN PATENT DOCUMENTS

| JP | 2539163 | 7/1996 |
| JP | 2002-55435 | 2/2002 |
| JP | 3615181 | 11/2004 |
| JP | 2006/39148 | 2/2006 |
| JP | 2008-140911 | 6/2008 |
| JP | 2009-175587 | 8/2009 |
| JP | 2010-87166 | 4/2010 |
| JP | 2011-253933 | 12/2011 |
| JP | 5024842 | 6/2012 |

*Primary Examiner* — Christopher Young
(74) *Attorney, Agent, or Firm* — Oblon, McClelland, Maier & Neustadt, L.L.P.

(57) ABSTRACT

A method of focus measurement of the embodiment irradiates exposure light from a first direction and projects first and second line-and-space patterns on a substrate. Further, exposure light is irradiated from a second direction and third and fourth line-and-space patterns are projected on the substrate. By measuring a distance between the first and third line-and-space patterns on the substrate, a sum of a dislocated amount caused by dislocation of focus and an overlap dislocation amount between the first and third line-and-space patterns is calculated as a first dislocated amount. Further, by measuring a distance between the second and fourth line-and-space patterns on the substrate, an overlap dislocation amount between the second and fourth line-and-space patterns is calculated as a second dislocation amount. Further, based on the first and second dislocation amounts, the focus dislocation amount is calculated.

13 Claims, 16 Drawing Sheets

13Aout
13Bin

13Aout, 13Bin
L2

US 9,128,388 B2

METHOD OF FOCUS MEASUREMENT, EXPOSURE APPARATUS, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2013-124809, filed on Jun. 13, 2013; the entire contents of which are incorporated herein by reference.

FIELD

Embodiments described herein relate generally to a method of focus measurement, an exposure apparatus, and a method of manufacturing semiconductor device.

BACKGROUND

In an optical lithography step upon manufacturing a semiconductor device, a so-called blurred state occurs if a focus position of an exposure apparatus is not suitably set in a case of forming a circuit pattern. In this case, a desired circuit pattern cannot be formed on a semiconductor substrate. Due to this, accompanying refinement of a circuit pattern used for the semiconductor device, focus accuracy in the exposure apparatus is becoming one of the most important factors.

In an exposure apparatus that uses ArF with alight source wavelength of 193 nm or a KrF excimer laser with that of 248 nm, a plurality of permeating portions having a phase difference is provided on a photo mask, and the focus position was measured by using the phase difference.

However, an EUV (Extreme Ultraviolet) exposure apparatus of which development is under progress as a next generation exposure apparatus has a very short light source wavelength of 13.5 nm. Due to this, in order to provide the phase difference necessary for measuring the focus position, a step amount of a step to be provided on the photo mask becomes 3 nm, which is very small. Accordingly, it is difficult to obtain sufficient processing accuracy for the step to be provided on the photo mask.

Further, there is a method that measures the focus position by using a non-telecentric lighting. In this method, since the number of openings in a projection lens of the EUV exposure apparatus is small, only about 1 nm of dislocated amount can be observed relative to 10 nm of focus change. Due to this, sufficient inspection performance for the focus position cannot be obtained.

Accordingly, in a case where the inspection performance of the focus position is low, the desired circuit pattern cannot be formed on the semiconductor substrate, thus it is desired to accurately measure the focus position.

DETAILED DESCRIPTION

According to an embodiment, a method of focus measurement is provided. The method of focus measurement includes a first exposing step and a second exposing step. In the first exposing step, first exposure light is irradiated onto a first line-and-space pattern and a second line-and-space pattern from a first direction that is displaced from an optical axis of an optical system, and the first and second line-and-space patterns are projected on a substrate onto which a photosensitive material is applied. The first line-and-space pattern has a first pattern pitch, and the second line-and-space pattern has a second pattern pitch. Further, in the second exposing step, second exposure light is irradiated from a second direction that is displaced from the optical axis of the optical system onto a third line-and-space pattern and a fourth line-and-space pattern, and the third and fourth line-and-space patterns are projected on the substrate. The third line-and-space pattern has the first pattern pitch, and the fourth line-and-space pattern has the second pattern pitch. Further, the method of focus measurement includes a first dislocation amount calculating step, a second dislocation amount calculating step, and a focus calculating step. In the first dislocation amount calculating step, a sum of a dislocated amount caused by dislocation of focus and an overlap dislocation amount between the first and third line-and-space patterns is calculated as a first dislocation amount by measuring a distance between the first line-and-space pattern and the third line-and-space pattern on the substrate. Further, in the second dislocation amount calculating step, an overlap dislocation amount between the second and fourth line-and-space patterns is calculated as a second dislocation amount by measuring a distance between the second line-and-space pattern and the fourth line-and-space pattern on the substrate. Further, in the focus calculating step, the focus dislocation amount is calculated based on the first and second dislocation amounts.

Hereinbelow, a method of focus measurement, an exposure apparatus, and a method of manufacturing a semiconductor device according to an embodiment will be described in detail with reference to the drawings. Notably, the invention is not limited by this embodiment.

Embodiment

Figure 1:
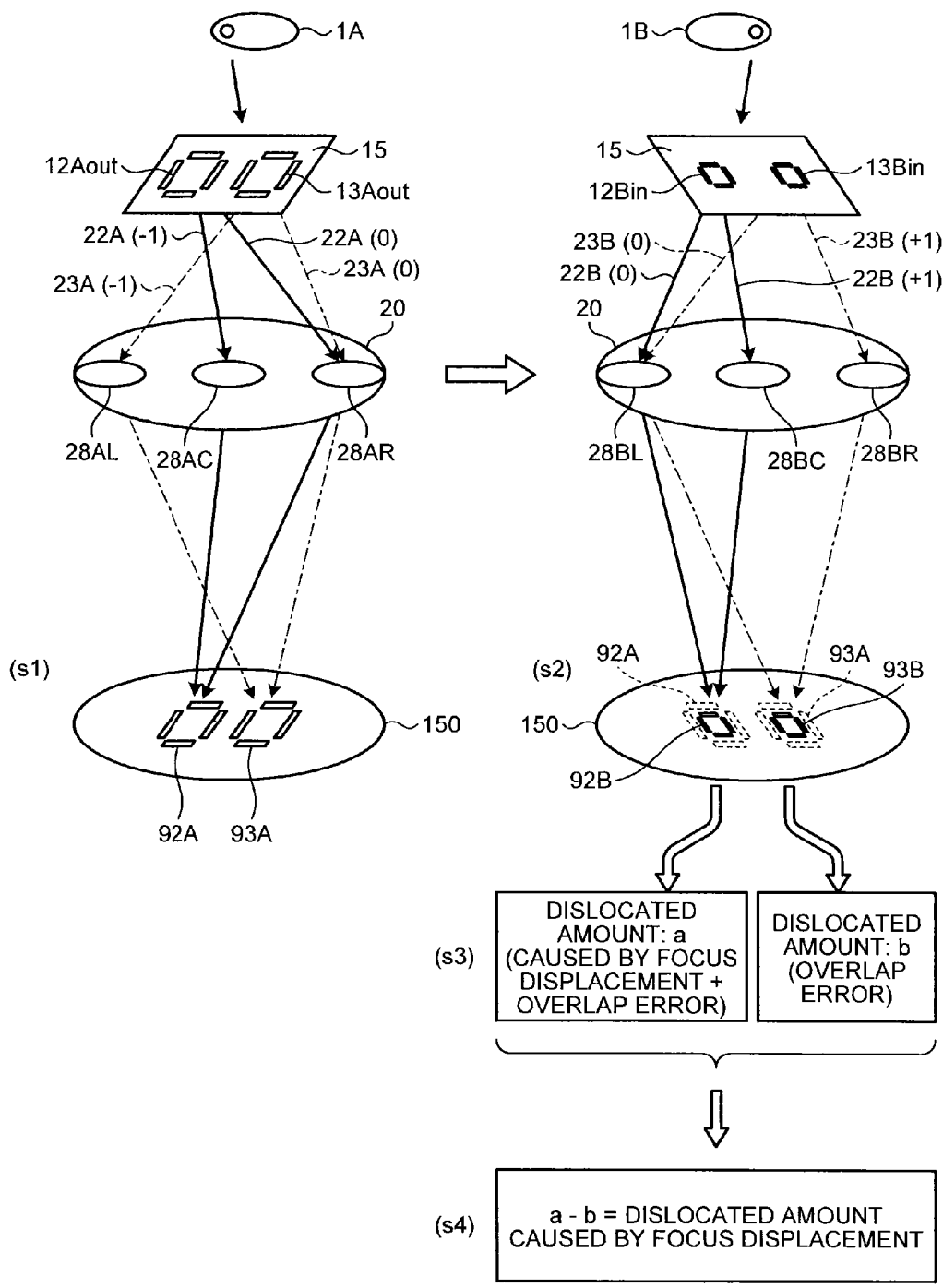
FIG. 1 is a diagram for explaining a concept of a method of focus measurement of an embodiment.

FIG. 1 is a diagram for explaining a concept of the method of focus measurement according to an embodiment. In the embodiment, a pattern is formed on a wafer by using a diffraction pattern, and measures a focus position of the exposure apparatus by measuring a dislocated amount of the formed pattern. In measuring the focus position of the exposure apparatus, at least two lighting conditions and at least two inspection marks are used. The exposure apparatus of which focus position is measured is for example an EUV (Extreme Ultraviolet) exposure apparatus and the like.

In measuring the focus position, a first lighting that is a first lighting condition and a second lighting that is a second lighting condition are used. The first and second lightings are for example mono-pole lightings (mono-pole off-axis lighting). The first and second lighting conditions are for example positions where the diffracted light inscribes an NA (numerical aperture) of a lighting optical system. A light source of the first lighting and a light source of the second lighting are designed so as to satisfy a relationship of a two rotational symmetry (180° rotational symmetry) with an optical axis center position of the optical system of the exposure apparatus as a symmetry center.

The inspection marks are formed on a reticle (mask) in advance. The inspection marks may have any shape. The inspection marks are for example marks with a same shape as marks used upon inspecting dislocation between layers (for example, bar-in-bar pattern).

The exposure apparatus of the embodiment includes a lighting 1A that is the first lighting, and a lighting 1B that is the second lighting. The lighting 1A irradiates exposure light onto a reticle 15 upon an exposure process for the first time, and the lighting 1B irradiates exposure light onto the reticle 15 upon an exposure process for the second time.

The first and second inspection marks are formed on the reticle 15. The first inspection mark (inspection mark 10 to be described later) is configured by including a pattern region 12Aout and a pattern region 12Bin. Further, the second inspection mark (inspection mark 11 to be described later) is configured by including a pattern region 13Aout and a pattern region 13Bin.

The pattern region 12Aout is arranged in a region that is on an outer side than the pattern region 12Bin when the reticle 15 is seen from a top surface side. The pattern region 13Aout is arranged in a region that is on the outer side than the pattern region 13Bin when the reticle 15 is seen from the top surface side.

The pattern region 12Aout and the pattern region 13Aout are regions where the exposure light is irradiated by the lighting 1A upon the exposure process for the first time, and diffraction patterns are provided therein. Further, the pattern region 12Bin and the pattern region 13Bin are regions where the exposure light is irradiated by the lighting 1B upon the exposure process for the second time, and diffraction patterns are provided therein.

Exposure Process for the First Time (s1)

Upon the exposure process for the first time, the lighting 1A irradiates the exposure light to the pattern region 12Aout in the inspection mark 10, and irradiates the exposure light to the pattern region 13Aout in the inspection mark 11. Due to this, negative first order diffracted light 22A(−1) and zero order light 22A(0) are irradiated from the pattern region 12Aout onto a projection lens (pupil surface) 20. Among them, the negative first order diffracted light 22A(−1) is irradiated in a region 28AC on the projection lens 20, and the zero order light 22A(0) is irradiated in a region 28AR on the projection lens 20.

Further, negative first order diffracted light 23A(−1) and zero order light 23A(0) are irradiated from the pattern region 13Aout onto the projection lens 20. Among them, the negative first order diffracted light 23A(−1) is irradiated in a region 28AL on the projection lens 20, and the zero order light 23A(0) is irradiated in a region 28AR on the projection lens 20.

The region 28AC is a region at a center portion on the projection lens 20, and includes the optical axis center position. The region 28AL is a region at an end portion (left end side in FIG. 1) on the projection lens 20, and does not include the optical axis center position. The region 28AR is a region at an end portion (right end side in FIG. 1) on the projection lens 20, and does not include the optical axis center position. The region 28AL and the region 28AR oppose each other with the region 28AC in between.

The negative first order diffracted light 22A(−1) irradiated to the region 28AC and the zero order light 22A(0) irradiated to the region 28AR form an image on a semiconductor substrate (wafer 150). Further, the negative first order diffracted light 23A(−1) irradiated to the region 28AL and the zero order light 23A(0) irradiated to the region 28AR form an image on the wafer 150.

A mark pattern 92A corresponding to the pattern region 12Aout and a mark pattern 93A corresponding to the pattern region 13Aout are formed on the wafer 150 by the wafer 150 being developed.

Exposure Process for the Second Time (s2)

Upon the exposure process for the second time, the lighting 1B irradiates the exposure light to the pattern region 12Bin in the inspection mark 10, and irradiates the exposure light to the pattern region 13Bin in the inspection mark 11. Due to this, zero order light 22B(0) and positive first order diffracted light 22B(+1) are irradiated from the pattern region 12Bin onto the projection lens 20. Among them, the zero order light 22B(0) is irradiated in a region 28BL on the projection lens 20, and the positive first order diffracted light 22B(+1) is irradiated in a region 28BC on the projection lens 20.

Further, zero order light 23B(0) and positive first order diffracted light 23B(+1) are irradiated from the pattern region 13Bin onto the projection lens 20. Among them, the zero order light 23B(0) is irradiated in a region 28BL on the projection lens 20, and the positive first order diffracted light 23B(+1) is irradiated in a region 28BR on the projection lens 20.

The region 28BC is a region at the center portion on the projection lens 20, and includes the optical axis center position. The region 28BL is a region at the end portion (left end side in FIG. 1) on the projection lens 20, and does not include the optical axis center position. The region 28BR is a region at the end portion (right end side in FIG. 1) on the projection lens 20, and does not include the optical axis center position. The region 28BL and the region 28BR oppose each other with the region 28BC in between.

The zero order light 22B(0) irradiated to the region 28BL and the positive first order diffracted light 22B(+1) irradiated to the region 28BC form an image on the wafer 150. Further, the zero order light 23B(0) irradiated to the region 28BL and the positive first order diffracted light 23B(+1) irradiated to the region 28BR form an image on the wafer 150.

A mark pattern 92B corresponding to the pattern region 12Bin and a mark pattern 93B corresponding to the pattern region 13Bin are formed on the wafer 150 by the wafer 150 being developed.

Calculation Process of Dislocated Amount Using Inspection Mark 10 (s3)

A dislocated amount a between the mark pattern 92A corresponding to the pattern region 12Aout of the inspection mark 10 and the mark pattern 92B corresponding to the pattern region 12Bin of the inspection mark 10 is measured. Due to this, the dislocated amount a that adds a dislocated amount caused by the focus displacement and an overlap dislocation amount (overlap error) generated when the exposure apparatus performs the two times of exposures is measured. The overlap dislocation amount herein is a dislocated amount generated due to a mechanical portion of the exposure apparatus.

Further, a dislocated amount b between the mark pattern 93A corresponding to the pattern region 13Aout and the mark pattern 93B corresponding to the pattern region 13Bin is measured. Since there is a bilateral symmetric relationship with the optical axis of the optical system as the center respectively between the region 28AL and the region 28AR, and between the region 28BL and the region 28BR, a dislocation caused by the focus displacement does not occur between the mark patterns 93A, 93B. Thus, by measuring the dislocated amount b, the overlap dislocation amount generated upon when the exposure apparatus performs the two times of exposures is measured. The dislocated amounts a, b are for example measured by using an overlap dislocation inspecting apparatus and the like.

Calculation Process of Dislocated Amount Caused by Focus Displacement (s4)

It becomes possible to calculate the dislocated amount caused by the focus displacement by subtracting the dislocated amount b from the dislocated amount a. Specifically, a-b is the dislocated amount caused by the focus displacement.

Notably, the positions of the regions 28AL, 28AR are not limited to the aforementioned positions, and may be at other positions. Further, the positions of the regions 28BL, 28BR are not limited to the aforementioned positions, and may be at other positions.

Figure 2:
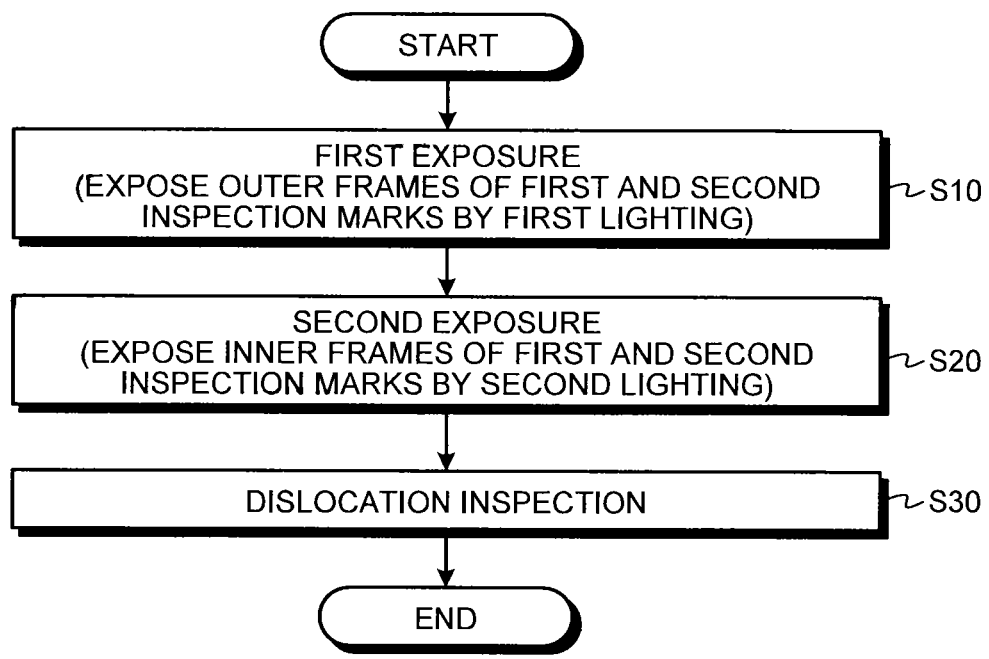
FIG. 2 is a flowchart illustrating a process procedure of a focus measurement process of the embodiment.

FIG. 2 is a flowchart illustrating a process procedure of a focus measurement process of the embodiment. Upon inspecting the focus position, a first exposure process is performed on the wafer 150. Specifically, parts of the first and second inspection marks (pattern region 12Aout and pattern region 13Aout) are exposed by using the lighting 1A that is the first lighting, and the pattern region 12Aout and the pattern region 13Aout are printed on the wafer 150 (step S10). The pattern regions 12Aout, 13Aout are respectively outer frame patterns of the inspection marks 10, 11.

Further, a second exposure process is performed on the wafer 150. Specifically, parts of the first and second inspection marks (pattern region 12Bin and pattern region 13Bin) are exposed by using the lighting 1B that is the second lighting, and the pattern region 12Bin and the pattern region 13Bin are printed on the wafer 150 (step S20). The pattern regions 12Bin, 13Bin are respectively inner frame patterns of the inspection marks 10, 11.

Thereafter, a dislocation inspection is performed. Specifically, the dislocated amount a of the mark pattern 92A corresponding to the pattern region 12Aout and the mark pattern 92B corresponding to the pattern region 12Bin is calculated. Further, the dislocated amount b of the mark pattern 93A corresponding to the pattern region 13Aout and the mark pattern 93B corresponding to the pattern region 13Bin is calculated. Then, based on the dislocated amounts a, b, the dislocated amount of the patterns printed on the wafer 150 is calculated, and the focus position of the exposure apparatus is calculated based on the dislocated amount (step S30). Notably, the printing of the pattern regions 12Aout, 13Aout, 12Bin, 13Bin onto the wafer 150 may be performed by any order.

Figure 3A:
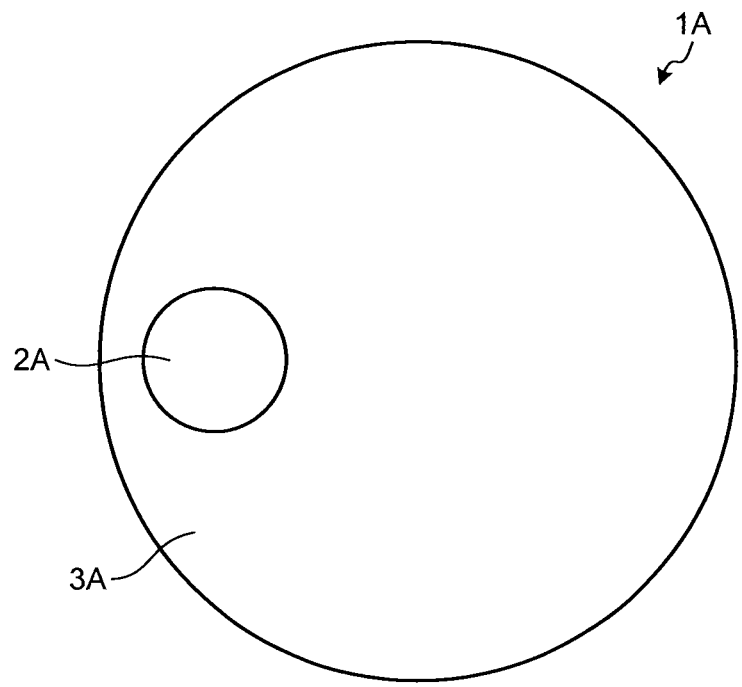
FIG. 3A is a plan diagram illustrating a configuration of a first lighting.
Figure 3B:
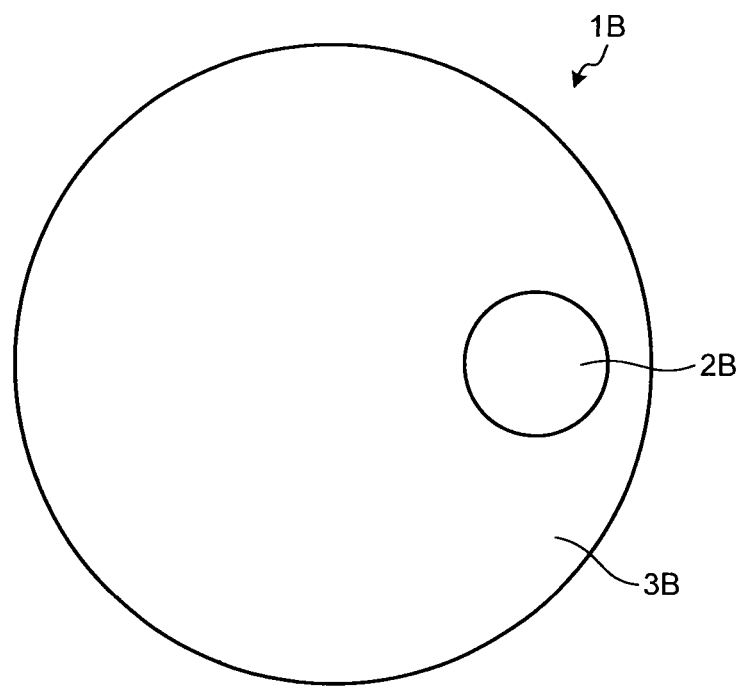
FIG. 3B is a plan diagram illustrating a configuration of a second lighting.

Next, configurations of the lighting 1A that is the first lighting and the lighting 1B that is the second lighting will be described. FIG. 3A is a plan diagram illustrating the configuration of the first lighting, and FIG. 3B is a plan diagram illustrating the configuration of the second lighting. In FIG. 3A, the lighting 1A in which a light source 2A is arranged is illustrated, and in FIG. 3B, the lighting 1B in which a light source 2B is arranged is illustrated.

The lighting 1A includes the light source 2A that is a lighting region (aperture), and a non-lighting region 3A, and the lighting 1B includes the light source 2B that is a lighting region (aperture), and a non-lighting region 3B. Light source shapes of the light sources 2A, 2B are respectively a circle.

The lighting 1A and the lighting 1B are for example monopole lightings. The light sources 2A, 2B have a relationship of a two rotational symmetry with the optical axis center position of the optical system of the exposure apparatus as a symmetry center. In other words, the light sources 2A, 2B are arranged at positions that oppose each other by intervening the optical axis center position in between. Notably, the light sources 2A, 2B are arranged so that the light sources 2A, 2B do not contain an optical axis center. Accordingly, the light sources 2A, 2B are arranged at the positions that are separated from the optical axis center by a predetermined distance.

Due to this, the lighting 1A irradiates first exposure light from a first direction that is offset from the optical axis center of the optical system onto the pattern regions 12Aout, 13Aout (diffraction patterns). Further, the lighting 1B irradiates second exposure light from a second direction that is offset from the optical axis center of the optical system onto the pattern regions 12Bin, 13Bin (diffraction patterns).

Figure 4A:
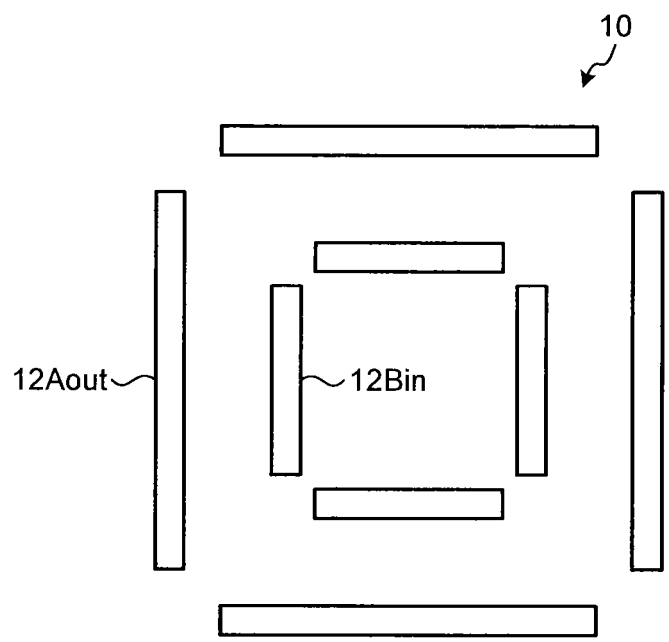
FIG. 4A is a plan diagram illustrating a configuration of a first inspection mark.
Figure 4B:
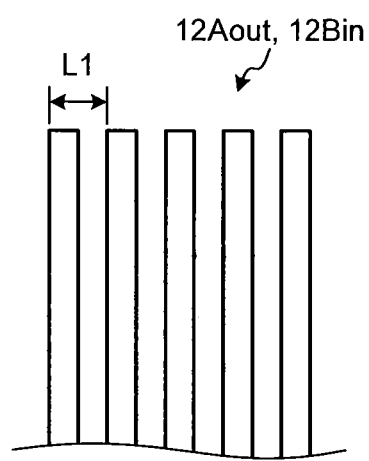
FIG. 4B is a diagram for explaining a pattern pitch of the first inspection mark.

Next, the configurations of the inspection mark 10 that is the first inspection mark and the inspection mark 11 that is the second inspection mark will be described. FIG. 4A is a plan diagram illustrating the configuration of the first inspection mark, and FIG. 4B is a diagram for explaining a pattern pitch of the first inspection mark.

The inspection mark 10 includes the pattern region 12Aout arranged on the outside and the pattern region 12Bin arranged on the inside. The pattern regions 12Aout, 12Bin are regions where line-and-space (L/S) patterns are arranged. A line-andspace pattern is a group of patterns in which line patterns having a predetermined line width and space patterns having a predetermined line width are arranged to align alternately in parallel.

The pattern regions 12Aout, 12Bin have groups of patterns with a pattern pitch L1 arranged therein. The pattern pitch L1 is a pattern pitch by which the negative first order diffracted light 22A(−1) is irradiated onto the region 28AC that is the center portion on the projection lens 20, and the zero order light 22A(0) is irradiated onto the region 28AR that is one of the end portions on the projection lens 20 when the exposure light from the lighting 1A is irradiated.

Further, the pattern pitch L1 is a pattern pitch by which the zero order light 22B(0) is irradiated onto the region 28BL that is one of the end portions on the projection lens 20, and the positive first order diffracted light 22B(+1) is irradiated onto the region 28BC that is the center portion on the projection lens 20 when the exposure light from the lighting 1B is irradiated.

Figure 5A:
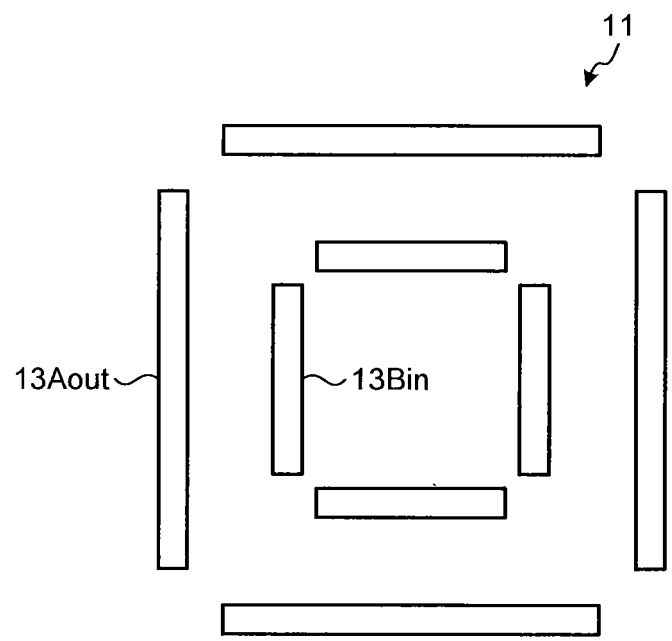
FIG. 5A is a plan diagram illustrating a configuration of a second inspection mark.
Figure 5B:
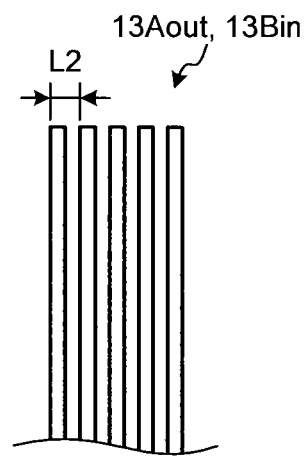
FIG. 5B is a diagram for explaining a pattern pitch of the second inspection mark.

FIG. 5A is a plan diagram illustrating the configuration of the second inspection mark, and FIG. 5B is a diagram for explaining a pattern pitch of the second inspection mark. The inspection mark 11 includes the pattern region 13Aout arranged on the outside and the pattern region 13Bin arranged on the inside. The pattern regions 13Aout, 13Bin are regions where groups of line-and-space patterns are arranged.

The pattern regions 13Aout, 13Bin have the groups of patterns with a pattern pitch L2 arranged therein. The pattern pitch L2 is a pattern pitch by which the negative first order diffracted light 23A(−1) is irradiated onto the region 28AL that is one of the end portions on the projection lens 20, and the zero order light 23A(0) is irradiated onto the region 28AR that is one of the end portions on the projection lens 20, when the exposure light from the lighting 1B is irradiated.

Further, the pattern pitch L2 is a pattern pitch by which the zero order light 23B(0) is irradiated onto the region 28BL that is one of the end portions on the projection lens 20, and the positive first order diffracted light 23B(+1) is irradiated onto the region 28BR that is one of the end portions on the projection lens 20 when the exposure light from the lighting 1B is irradiated.

The regions where the exposure light is to be irradiated onto the projection lens 20 are determined by the positions where the light sources 2A, 2B are arranged and the pattern pitches of the inspection marks 10, 11. Due to this, in the embodiment, the positions where the light sources 2A, 2B are arranged and the pattern pitches of the inspection marks 10, 11 are set in accordance with the regions on the projection lens 20 onto which the irradiation of the exposure light is desired.

For example, the positions where the light sources 2A, 2B are arranged may be fixed, and the pattern pitches of the inspection marks 10, 11 are set in accordance with the positions where the light sources 2A, 2B are arranged. Here, a method of setting the pattern pitches of the inspection marks 10, 11 will be described.

Figure 6:
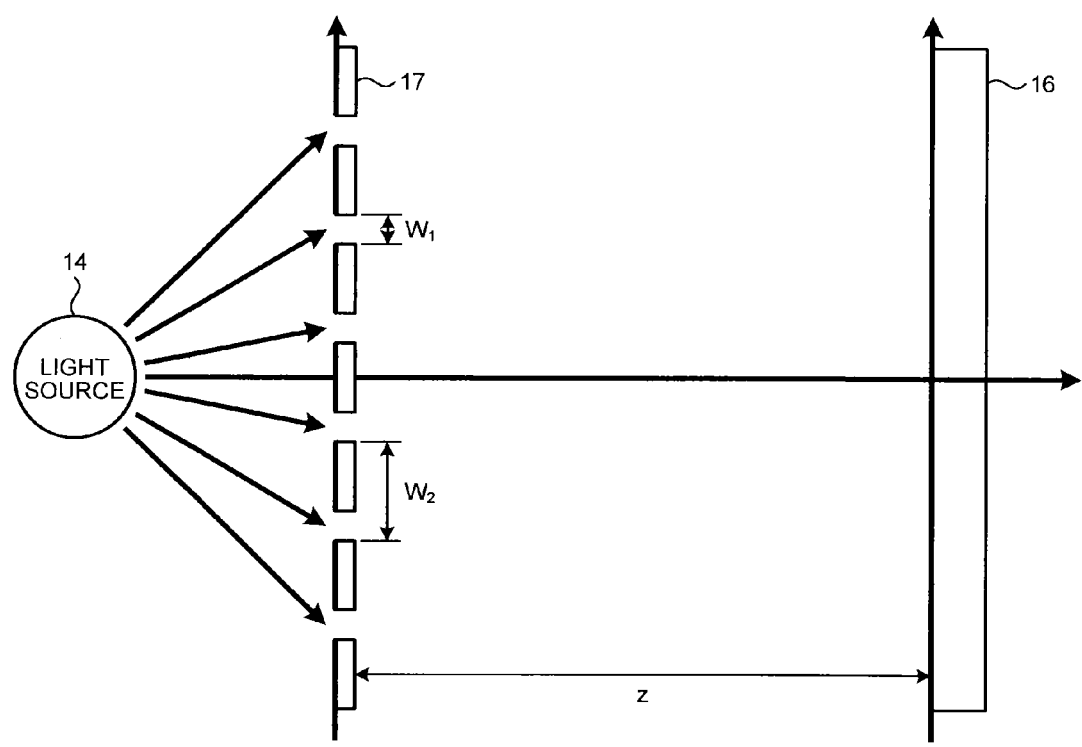
FIG. 6 is a diagram for explaining a relationship of a slit structure and an optical intensity on a screen.

FIG. 6 is a diagram for explaining a relationship of a slit structure and optical intensity on a screen. Here, the optical intensity will be described by using a light source 14, a slit 17 and a screen 16 instead of the light sources 2A, 2B, the reticle 15, and the wafer 150.

Light is irradiated from the light source 14 (left side relative to a sheet surface) onto the slit structure (slit 17) in which N pieces of apertures (N being a positive integer) having a limited width $W_1$ is aligned at a pitch $W_2$. In this case, in considering the screen (observing surface) 16 set up at a position (right side relative to the sheet surface) that is apart from the slit 17 by a distance z, generally the optical intensity on the screen 16 can be expressed by the following equation (1). Notably, $x_2$ in the equation (1) is a position of an m-th diffracted light (m being an integer) of an interference fringe, and $\lambda$ is a light source wavelength.

[Equation 1]

$$I(x_2, z) \propto I_0 \left\{ \frac{\sin\left(\frac{\pi W_2 N}{\lambda z} x_2\right)}{\sin\left(\frac{\pi W_2}{\lambda z} x_2\right)} \right\}^2 \left\{ \frac{\sin\left(\frac{\pi W_1}{\lambda z} x_2\right)}{\frac{\pi W_1}{\lambda z} x_2} \right\}^2 = I_0 \left\{ \frac{\sin\left(\frac{\pi W_2 N}{\lambda z} x_2\right)}{\sin\left(\frac{\pi W_2}{\lambda z} x_2\right)} \right\}^2 \mathrm{sinc}^2\left(\frac{W_1 x_2}{\lambda z}\right) \quad (1)$$

In the equation (1), a portion that is a division of sin functions is an intensity distribution of the interference fringe by the slit 17, and generally is known as Young's interference experiment. Further, a portion that is of a sin c function indicates an intensity distribution of the diffracted light from a single aperture. In order to obtain a maximum performance (maximum sensitivity) as the intensity distribution, it becomes necessary to obtain the distribution of the diffracted light as shown in FIG. 7, that is, to design a diffraction pattern (inspection mark) by which the intensity of positive second order diffracted light becomes 0.

Figure 7:
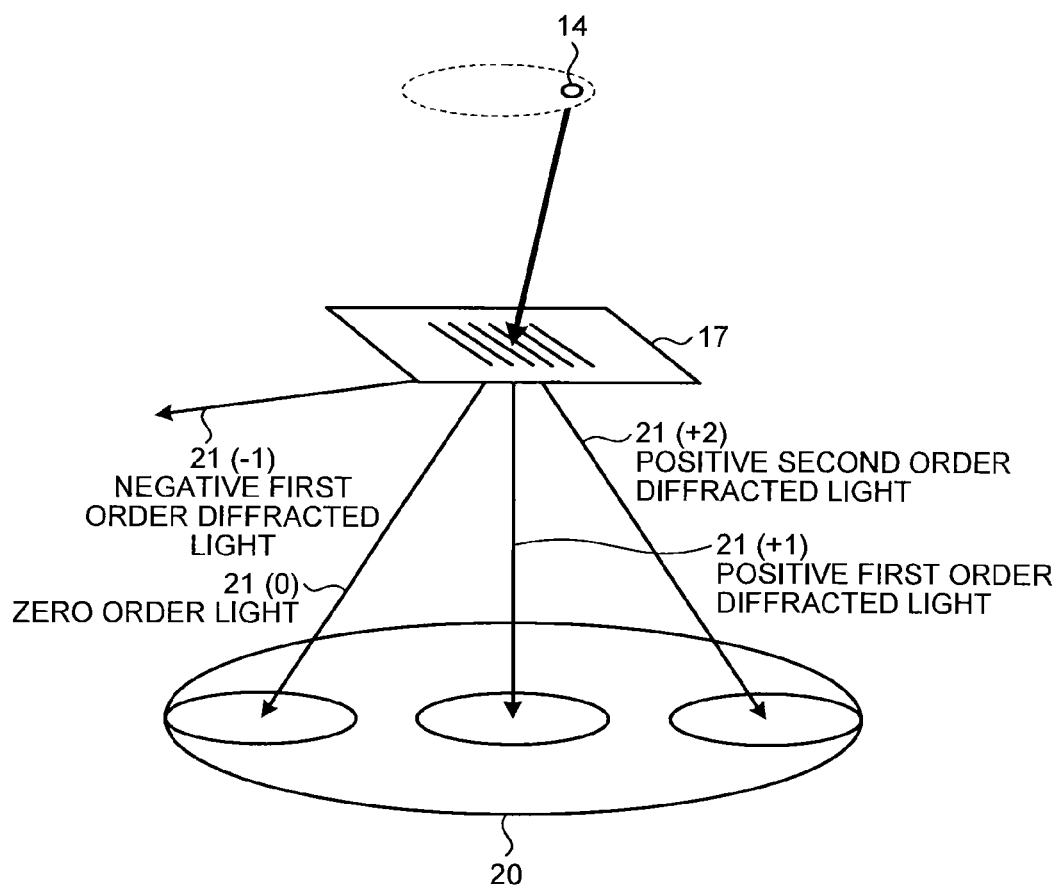
FIG. 7 is a diagram for explaining a relationship of a maximum sensitivity of diffracted light and positive second order diffracted light.

FIG. 7 is a diagram for explaining a relationship of the maximum sensitivity of the diffracted light and the positive second order diffracted light. The light having been emitted from the light source 14 is sent to the slit 17. The light having entered the slit 17 is separated into negative first order diffracted light 21(−1), zero order light 21(0), positive first order diffracted light 21(+1), and positive second order diffracted light 21(+2).

In FIG. 7, positions of respective diffracted lights are illustrated in a case where a diffraction optical intensity of the positive second order diffracted light 21(+2) is 0. In a case where a center of the positive first order diffracted light 21(+1) and a center on the projection lens 20 (center of pupil surface) match, the diffraction optical intensity of the positive second order diffracted light 21(+2) becomes 0, and the maximum sensitivity can be obtained.

In order to obtain the diffraction pattern by which the intensity of the positive second order diffracted light 21(+2) becomes 0, a position by which the intensity distribution of the interference fringe by the slit 17 becomes maximum, and a condition by which the intensity distribution of the diffracted light from the single aperture becomes 0 are calculated.

Firstly, the position $x_2$ of the m-th diffracted light of the interference fringe is expressed by an equation (2) according to the Young's interference experiment.

[Equation 2]

$$x_2 = m \frac{\lambda z}{W_2} \quad (2)$$

On the other hand, a position where the intensity distribution of the diffracted light from the single aperture becomes 0 is expressed by the following equation (3), from the equation (1) where n is an integer.

[Equation 3]

$$x_2 = n\frac{\lambda z}{W_1} \quad (3)$$

Accordingly, by calculating the position where the diffraction optical intensity becomes 0 from the equation (2) and the equation (3), the position where the diffraction optical intensity becomes 0 satisfies the following equation (4).

[Equation 4]

$$m = n\frac{W_2}{W_1} \quad (4)$$

Here, since m and n are integers, it can be understood that at least $W_2/W_1$ needs to be an integer in order for an intensity of particular diffracted light to become 0. Here, since the diffraction optical intensity of the positive second order diffracted light 21(+2) in a case of m=2 is desired to be 0, for example in considering a case of n=1, the diffraction optical intensity of the positive second order diffracted light 21(+2) can be caused to be 0 with $W_2=2\times W_1$, that is, with a line-and-space pattern of 1:1.

Notably, in a case of differing from the distribution of the diffracted light as illustrated in FIG. 7 (a case in which the positive first order diffracted light 21(+1) and the center of the pupil surface do not match), the positive second order diffracted light 21(+2) does not necessarily need to become 0, however, in order to obtain the maximum sensitivity, the positive second order diffracted light 21(+2) needs to become 0.

Figure 8:
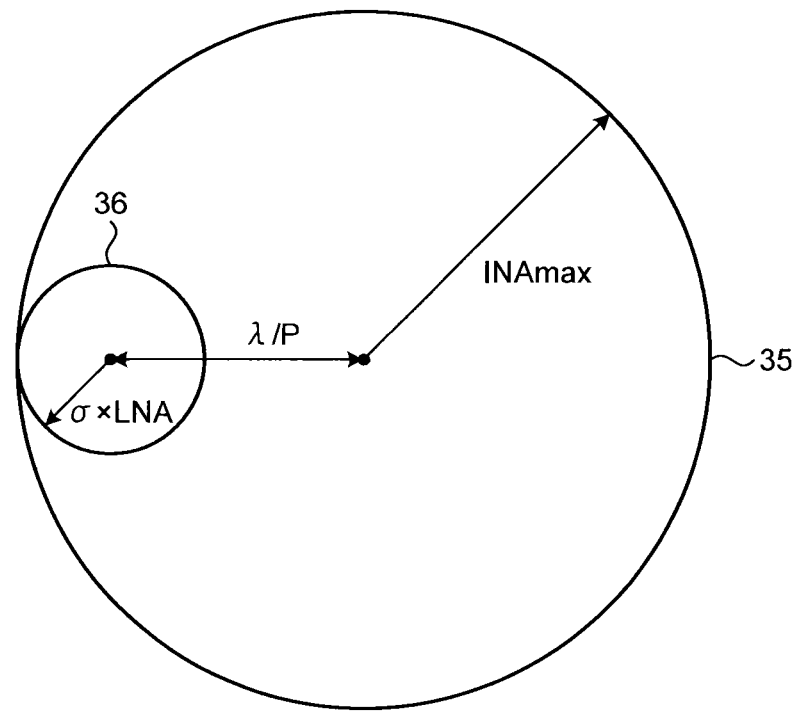
FIG. 8 is a diagram for explaining a lighting condition for obtaining the maximum sensitivity.

Next, a suitable pitch for the line-and-space pattern of 1:1 is obtained. FIG. 8 is a diagram for explaining a lighting condition for obtaining the maximum sensitivity. FIG. 8 illustrates a plan diagram of a lighting optical system 35 and a diffracted light region 36. The diffracted light region 36 is a region of the diffracted light that is emitted from a light source and irradiated onto the lighting optical system 35. The lighting of the light source that irradiates the diffracted light region 36 is a mono-pole lighting.

In this case, the lighting condition to obtain the maximum sensitivity is a position at which the diffracted light region 36 inscribes the lighting optical system 35. In other words, a lighting condition by which an outer circumference of the diffracted light region 36 inscribes a circle expressed by NA (numerical aperture)=INAmax of the lighting optical system 35 is the lighting condition that can obtain the maximum sensitivity. Since the diffracted light region 36 corresponds to the shape and position of the light source, the lighting condition to obtain the maximum sensitivity is a position at which the light source inscribes the NA of the lighting optical system 35.

In order to satisfy this condition, the following equation (5) needs to be satisfied, where the pitch of the line-and-space pattern is P, the light source wavelength is $\lambda$, the NA of the projection lens is LNA, a partial coherence of the lighting optical system 35 is $\sigma$, and the maximum NA of the lighting optical system 35 is INAmax.

[Equation 5]

$$\left. \begin{array}{l} INA_{max} \geq \sigma \cdot LNA + \dfrac{\lambda}{P} \\ P \geq \dfrac{\lambda}{INA_{max} - \sigma \cdot LNA} \end{array} \right\} \quad (5)$$

Figure 9:
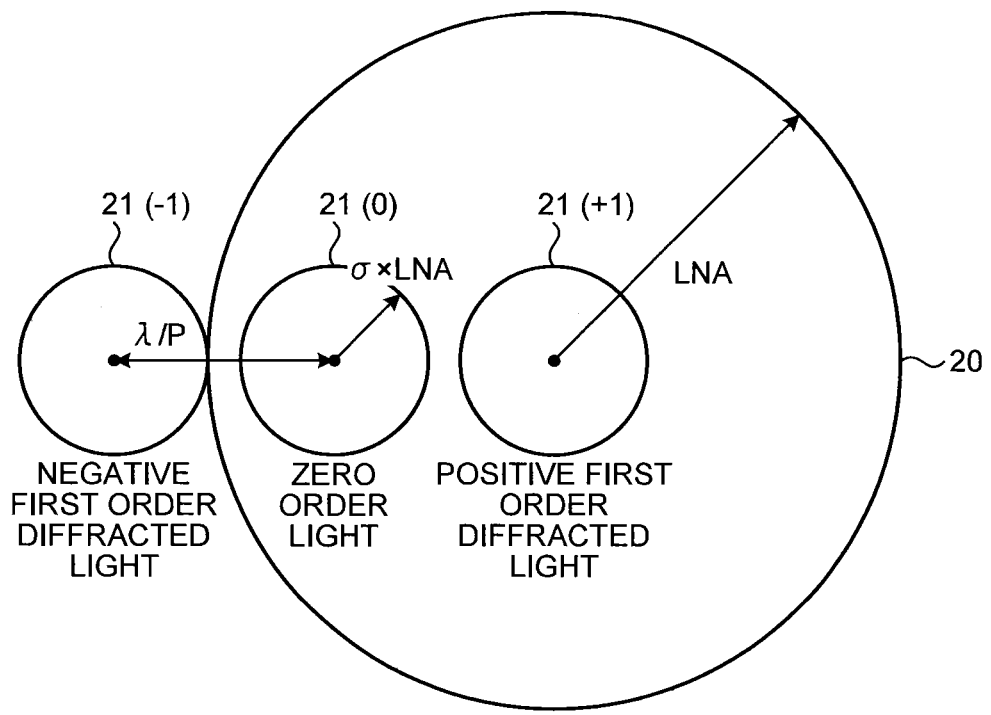
FIG. 9 is a diagram for explaining a positional relationship of positive first order diffracted light, negative first order diffracted light, and a projection lens.

FIG. 9 is a diagram for explaining positional relationships of the positive first order diffracted light and the negative first order diffracted light, and the projection lens. FIG. 9 illustrates a plan diagram of the projection lens 20. In order to satisfy the lighting condition for the maximum sensitivity, it becomes necessary that the positive first order diffracted light 21(+1) matches the optical axis center of the projection lens 20, and the negative first order diffracted light 21(−1) does not enter within the projection lens 20. In order to satisfy such a condition, the following equation (6) needs to be satisfied.

[Equation 6]

$$\left. \begin{array}{l} 2\dfrac{\lambda}{P} - \sigma \cdot LNA \leq LNA \\ P \leq \dfrac{2\lambda}{(1+\sigma)LNA} \end{array} \right\} \quad (6)$$

Accordingly, from the equation (5) and the equation (6), the following equation (7) is established.

[Equation 7]

$$\frac{\lambda}{INA_{max} - \sigma \cdot LNA} \leq P \leq \frac{2\lambda}{(1+\sigma)LNA} \quad (7)$$

Figure 10:
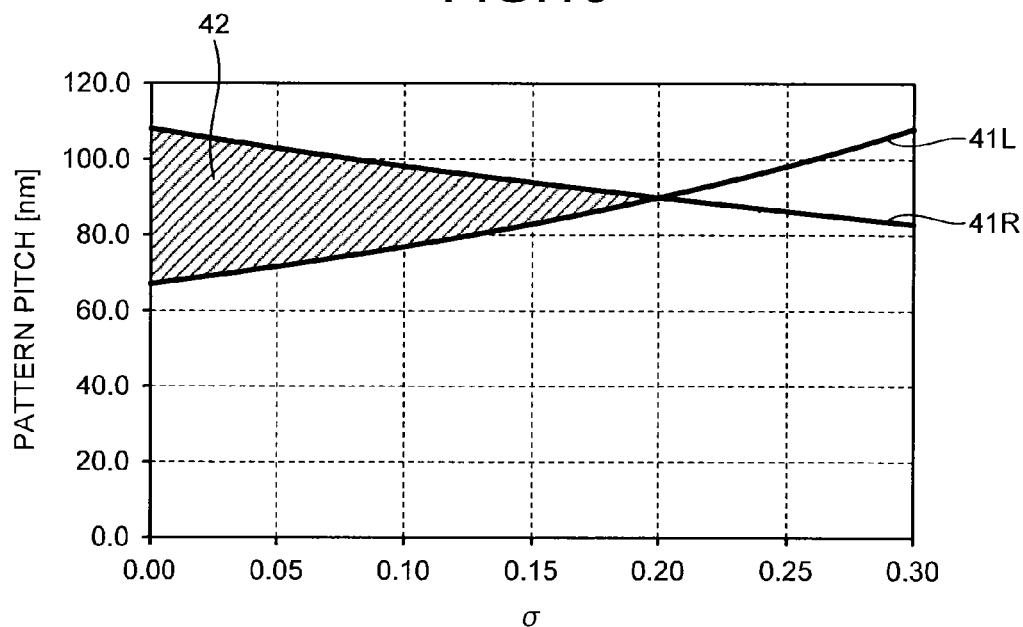
FIG. 10 is a diagram illustrating a relationship of a lighting condition and a pattern pitch.

For example, in considering an EUV exposure apparatus with the maximum NA of the lighting optical system at 0.20, the maximum NA of the projection lens 20 at 0.25, and the light source wavelength of 13.5 nm, a graph illustrated in FIG. 10 is obtained from the equation (7).

FIG. 10 is a diagram illustrating a relationship of the lighting condition and the pattern pitch. FIG. 10 illustrates the relationship of the lighting condition $\sigma$ and the pattern pitch (designed value) satisfying the equation (7). A region on an upper side than a relationship 41L corresponds to a left side of the inequality in the equation (7), and a region on a lower side than a relationship 41R corresponds to a right side of the inequality in the equation (7). Accordingly, a region 42 satisfying both of the relationship 41L and the relationship 41R is the region satisfying the relationship of the equation (7).

In order for the inequality of the equation (7) to be satisfied, it can be understood that the lighting condition needs to be smaller than 0.2. For example, when the lighting condition $\sigma$ to be used is set to 0.15, it can be understood that the pattern pitch required for the line-and-space pattern should be set to 83.0 nm or more and 93.9 nm or less, from the equation (7). Thus, in the embodiment, 85.0 nm is selected as one example of the pattern pitch.

Figure 11:
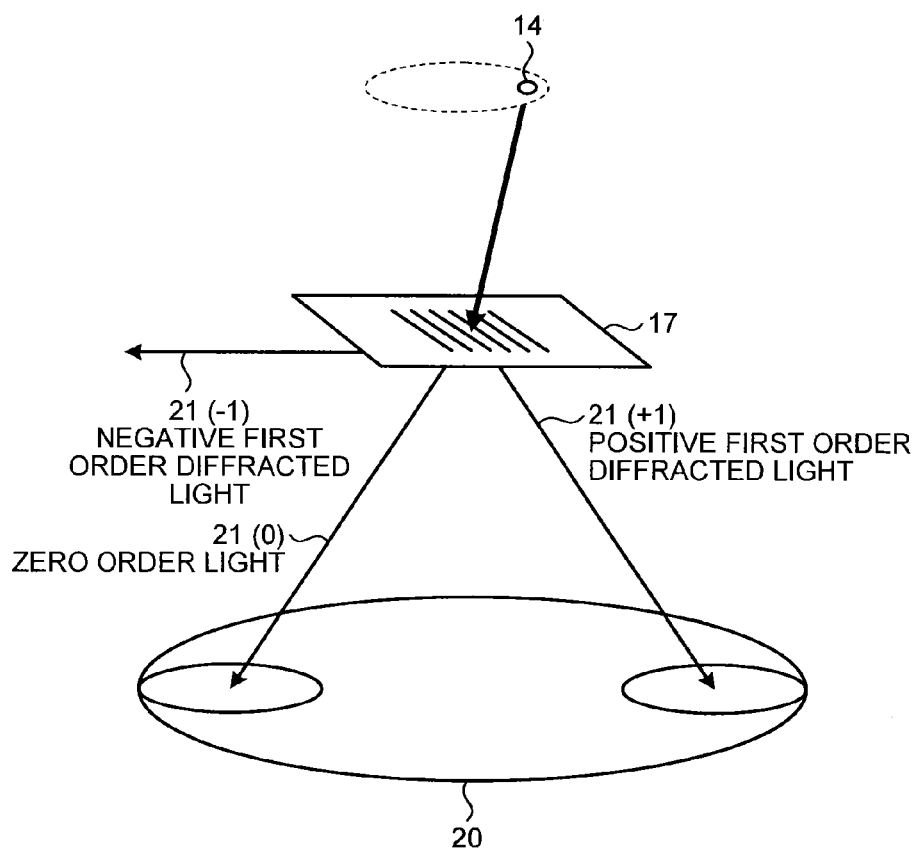
FIG. 11 is a diagram for explaining a method of designing the second inspection mark.

Next, a method of designing the inspection mark 11 that is the second inspection mark will be described. A pattern with a pitch that would exhibit a diffracted light distribution as illustrated in FIG. 11 is used for the inspection mark 11. FIG. 11 is a diagram for explaining the method of designing the second inspection mark. Here, the diffracted light in the case of using the slit 17 instead of the inspection mark 11 will be described.

Conditions required for the slit 17 in order to satisfy the lighting condition for the maximum sensitivity are as follows: (A) the optical intensity of the positive second order diffracted light 21(+2) is 0, (B) the negative first order diffracted light 21(−1) does not enter the projection lens 20, and (C) the zero order light 21(0) and the positive first order diffracted light 21(+1) enter the projection lens 20. Accordingly, the line-and-space pattern required for the slit 17 (inspection mark 11) needs only a half the pitch of the pattern used in the inspection mark 10. This can easily be calculated geometrically, since an aperture angle of the diffracted light in the case of using the inspection mark 11 is two times that of the diffracted light in the case of using the inspection mark 10.

The patterns designed according to the above are formed on the reticle 15 as the inspection mark 10 (first inspection mark) and the inspection mark 11 (second inspection mark). For example, the line-and-space pattern of 1:1 with the pattern pitch of 85.0 nm is formed as the inspection mark 10, and the line-and-space pattern of 1:1 with the pattern pitch of 170.0 nm is formed as the inspection mark 11 on the reticle 15.

Thereafter, first (first time) and second (second time) exposures using the inspection mark 10, and first and second exposures using the inspection mark 11 are performed. In other words, a first exposure process using the inspection marks 10, 11 and a second exposure process using the inspection marks 10, 11 are performed. In the first and second exposure processes, the maximum NA of the lighting optical system is set to 0.20, the maximum NA of the projection lens 20 is set to 0.25, and the light source wavelength is set to 13.5 nm. Further, the light source 2A of the lighting 1A that is the first lighting and the light source 2B of the lighting 1B that is the second lighting are designed to satisfy the relationship of two rotational symmetry with the optical axis center position of the optical system as the symmetry center.

Figure 12A:
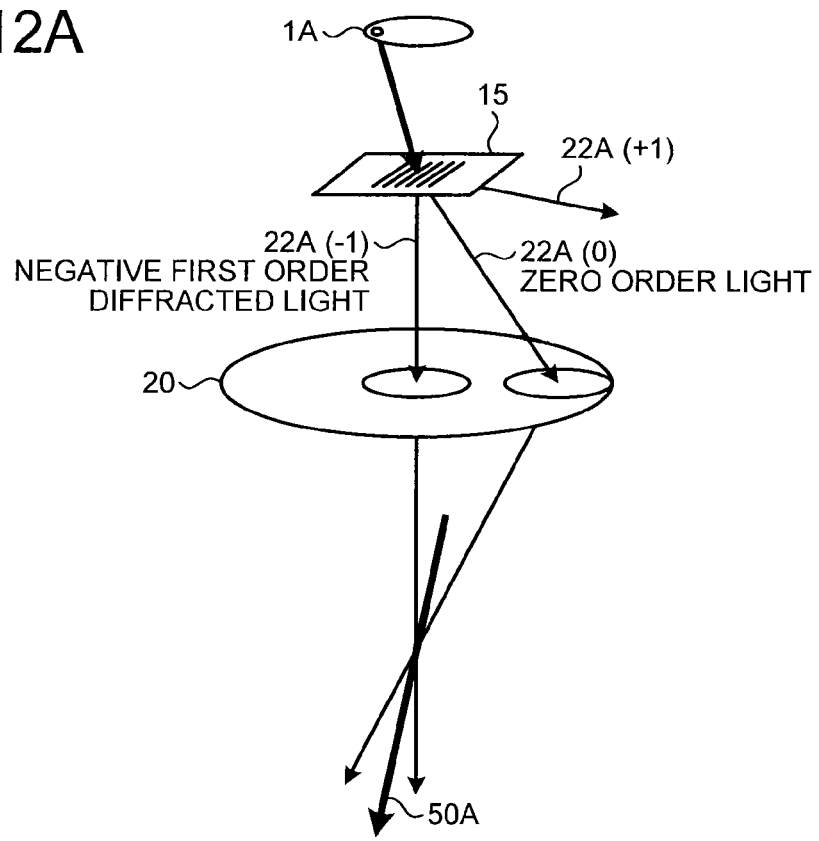
FIG. 12A is a diagram for explaining a first exposure process using the first inspection mark.
Figure 12B:
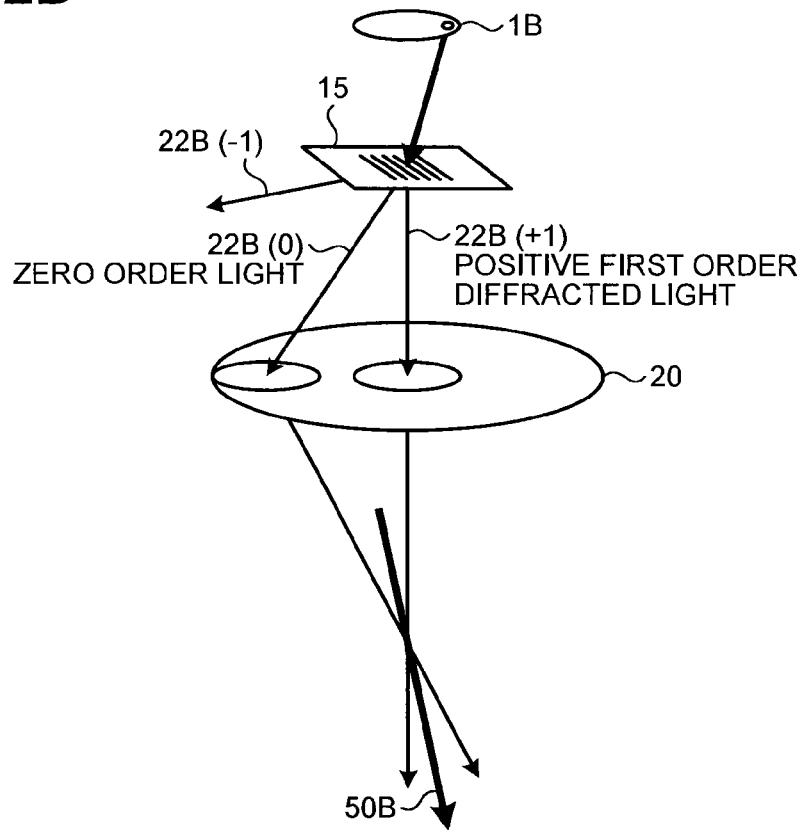
FIG. 12B is a diagram for explaining a second exposure process using the first inspection mark.

FIG. 12A is a diagram for explaining the first exposure process using the first inspection mark, and FIG. 12B is a diagram for explaining the second exposure process using the first inspection mark. Notably, in FIG. 12A and FIG. 12B, the diffraction pattern is illustrated instead of the inspection mark 10.

When the first exposure process is performed by using the lighting 1A and the inspection mark 10 (pattern region 12Aout) on the reticle 15, the negative first order diffracted light 22A(−1) and the zero order light 22A(0) are irradiated on the projection lens 20. The negative first order diffracted light 22A(−1) and the zero order light 22A(0) having permeated through the projection lens 20 are printed at a position corresponding to the focus position. The position corresponding to the focus position herein is a position where the irradiated light 50A is irradiated onto the wafer 150.

Further, when the second exposure process is performed by using the lighting 1B and the inspection mark 10 (pattern region 12Bin) on the reticle 15, the positive first order diffracted light 22B(+1) and the zero order light 22B(0) are irradiated on the projection lens 20. The positive first order diffracted light 22B(+1) and the zero order light 22B(0) having permeated through the projection lens 20 are printed at a position corresponding to the focus position. The position corresponding to the focus position herein is a position where the irradiated light 50B is irradiated onto the wafer 150.

As illustrated in FIG. 12A and FIG. 12B, when the focus position is displaced, the positions where the patterns are printed by the first exposure and the second exposure are displaced in opposite directions as in the irradiated light 50A, 50B. Due to this, the displacement amount of the printed positions by the focus position can be detected by a doubled magnitude. However, the dislocated amount $dx_1$ of the inspection mark 10 in the case of printing the pattern in the procedures shown in FIG. 12A and FIG. 12B is expressed by a sum of a dislocated amount (d(focus)) of the focus position and an overlap error (d(overlay)) by the two times of exposures as illustrated in the equation (8).

[Equation 8]

$$dx_1 = d(\text{focus}) + d(\text{overlay}) \quad (8)$$

Figure 13A:
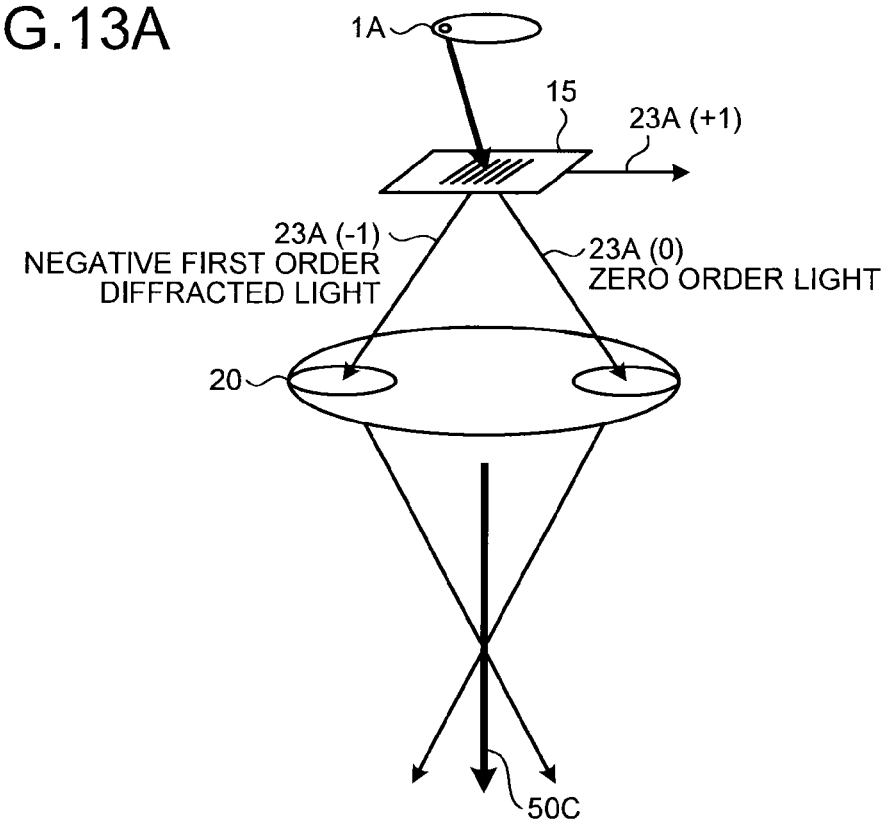
FIG. 13A is a diagram for explaining a first exposure process using the second inspection mark.
Figure 13B:
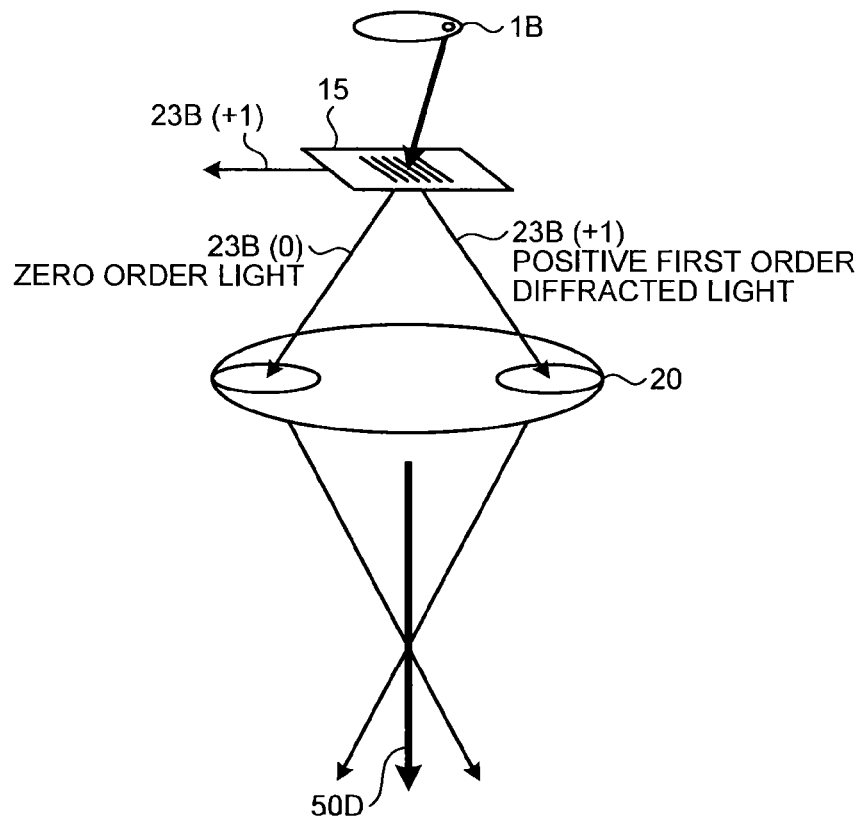
FIG. 13B is a diagram for explaining a second exposure process using the second inspection mark.

Accordingly, in order to remove the overlap error from the equation (8), the dislocated amount of the inspection mark 11 is used. FIG. 13A is a diagram for explaining the first exposure process using the second inspection mark, and FIG. 13B is a diagram for explaining the second exposure process using the second inspection mark. Notably, in FIG. 13A and FIG. 13B, the diffraction pattern is illustrated instead of the inspection mark 11.

When the first exposure process is performed by using the lighting 1A and the inspection mark 11 (pattern region 13Aout) on the reticle 15, the negative first order diffracted light 23A(−1) and the zero order light 23A(0) are irradiated on the projection lens 20. The negative first order diffracted light 23A(−1) and the zero order light 23A(0) having permeated through the projection lens 20 are printed at a position that is not generated by the focus position. The position corresponding to the focus position herein is a position where the irradiated light 50C is irradiated onto the wafer 150.

Further, when the second exposure process is performed by using the lighting 1B and the inspection mark 11 (pattern region 13Bin) on the reticle 15, the positive first order diffracted light 23B(+1) and the zero order light 23B(0) are irradiated on the projection lens 20. The positive first order diffracted light 23B(+1) and the zero order light 23B(0) having permeated through the projection lens 20 are printed at a position not caused by the focus position. The position corresponding to the focus position herein is a position where the irradiated light 50D is irradiated onto the wafer 150.

As illustrated in FIG. 13A and FIG. 13B, the inspection mark 11 does not change the printed position by the focus position. Accordingly, the dislocated amount $dx_2$ of the inspection mark 11 in the case of printing the pattern by the procedures illustrated in FIG. 13A and FIG. 13B is caused purely by the overlap error (d(overlay)) as illustrated in the equation (9).

[Equation 9]

$$dx_2 = d(\text{overlay}) \quad (9)$$

Figure 14:
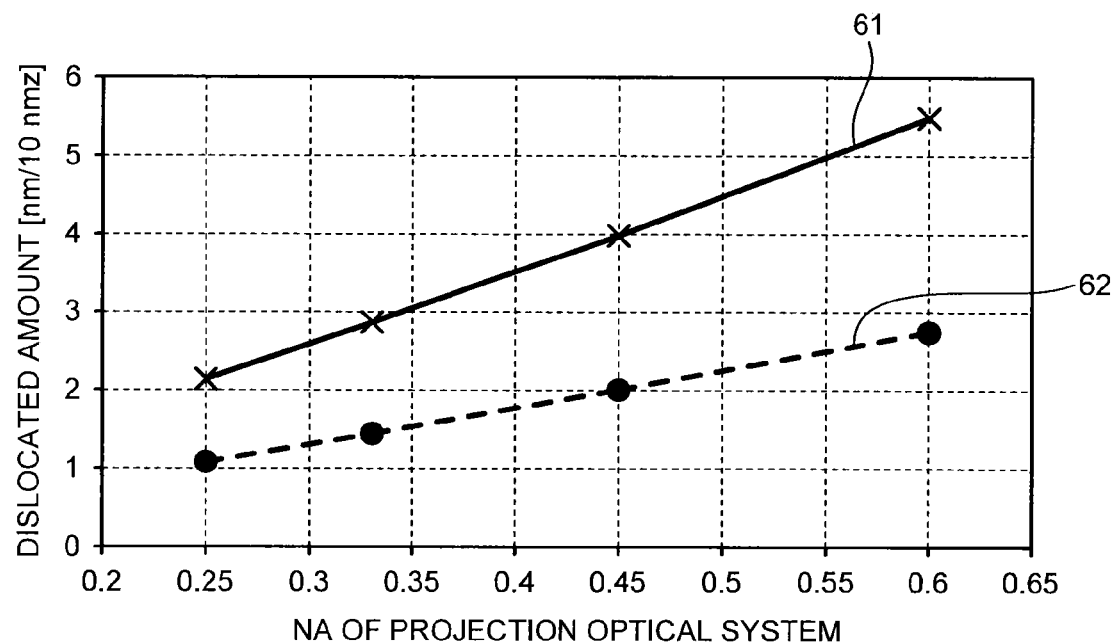
FIG. 14 is a diagram illustrating a dislocated amount relative to a focus displacement amount.

Accordingly, by reducing the $dx_2$ of the equation (9) from $dx_1$ of the equation (8), the print position dislocated amount caused purely and only by the focus position can be calculated. FIG. 14 is a diagram illustrating the dislocated amount relative to the focus displacement amount. FIG. 14 illustrates a sensitivity of dislocation detection relative to the focus displacement amount. A horizontal axis of FIG. 14 is an NA of a projection optical system, and a vertical axis is the dislocated amount. FIG. 14 illustrates conventional dislocation characteristics 62 and dislocation characteristics 61 of the embodiment in a case where defocusing of 10 nm is generated. As illustrated in FIG. 14, in a case of same NA, the dislocated amount of the embodiment exhibits doubled dislocated amount compared to the conventional dislocated amount.

In the embodiment, a dislocation inspection with doubled sensitivity was realized compared to the conventional dislocation inspection. Accordingly, since the dislocated amount of the inspection mark can be detected by the doubled sensitivity compared to the conventional case, the focus dislocation amount can be detected with the doubled sensitivity compared to the conventional case. Accordingly, it became possible to realize a sufficient focus inspection performance even with a low NA exposure apparatus.

Figure 15A:
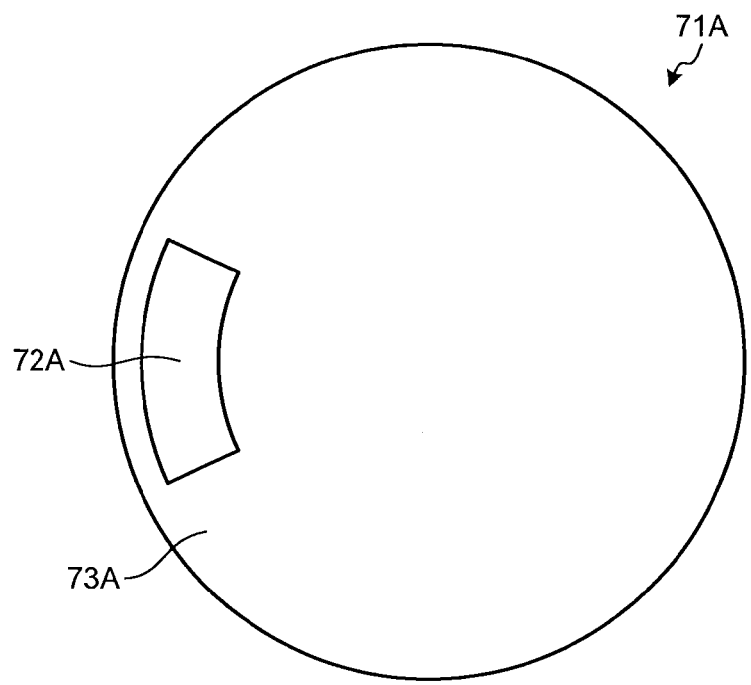
FIG. 15A is a diagram illustrating a configuration of a first lighting in a case in which a light source shape is a sector shape.
Figure 15B:
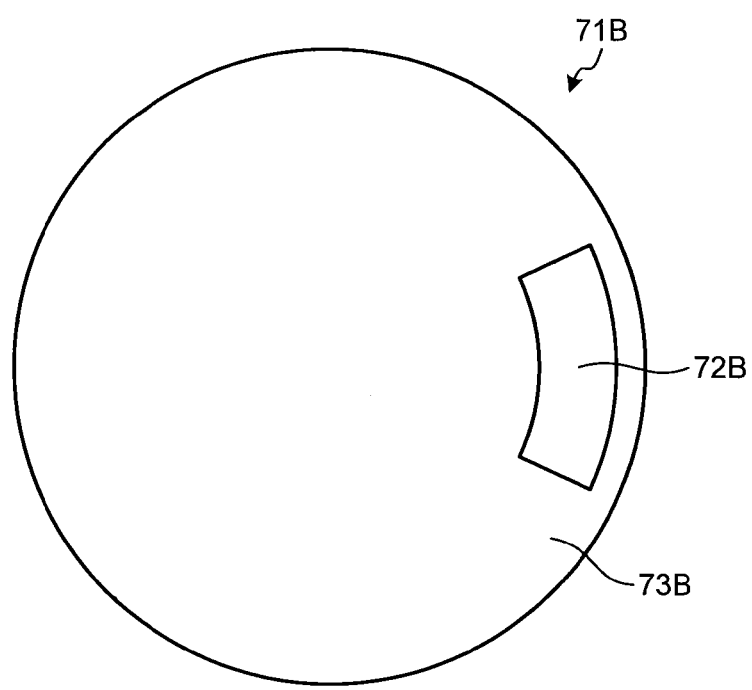
FIG. 15B is a diagram illustrating a configuration of a second lighting in a case in which a light source shape is a sector shape.

Notably, in the embodiment, the case of forming the light source shape of the light sources 2A, 2B in a circle shape was explained, however, light sources with other shapes may be used. FIG. 15A is a diagram illustrating a configuration of the first lighting in a case in which the light source shape is a sector shape, and FIG. 15B is a diagram illustrating a configuration of the second lighting in the case in which the light source shape is a sector shape.

A lighting 71A includes a light source 72A that is a sector shaped lighting region and a non-lighting region 73A, and a lighting 71B includes a light source 72B that is a sector shaped lighting region and a non-lighting region 73B. In this case also, a relationship of a two rotational symmetry with an optical axis center position of the optical system as a symmetry center resides between the light source 72A and the light source 72B.

Figure 16A:
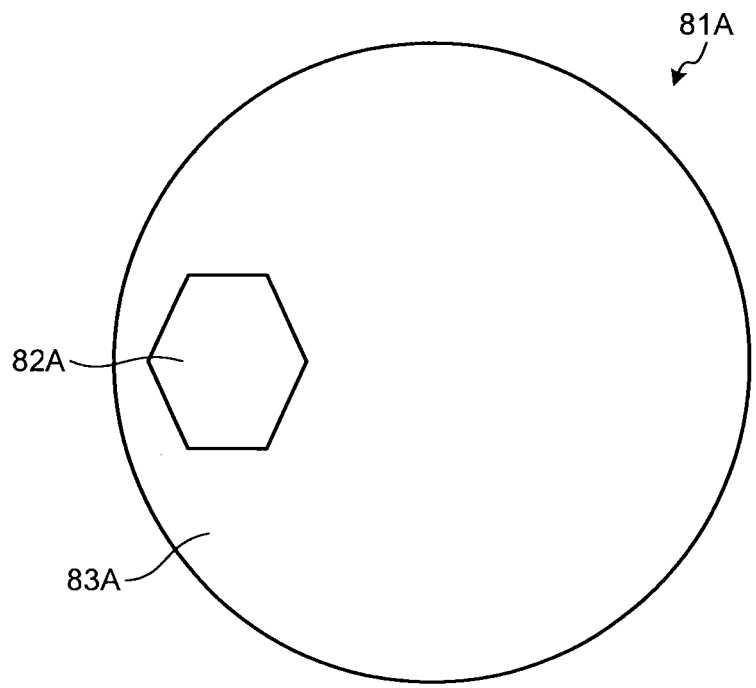
FIG. 16A is a diagram illustrating a configuration of the first lighting in a case in which the light source shape is a polygonal shape.
Figure 16B:
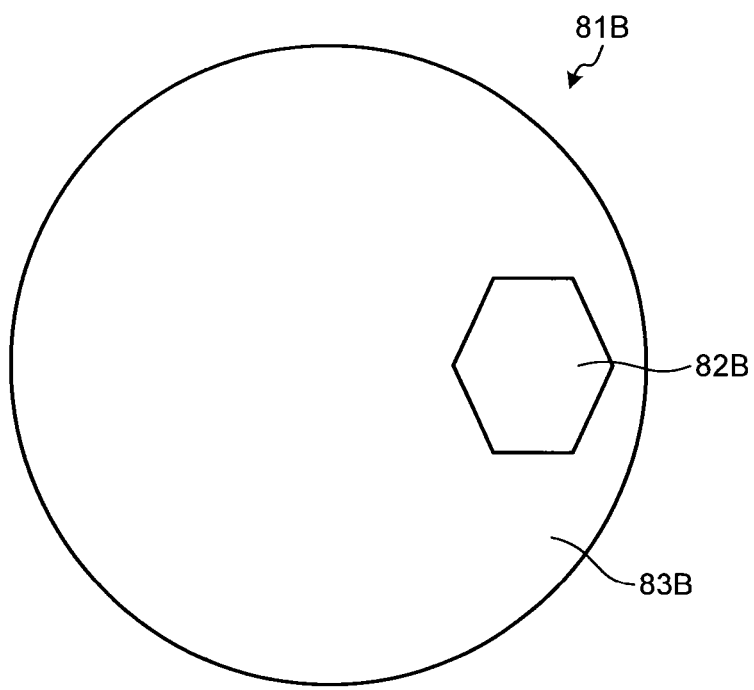
FIG. 16B is a diagram illustrating a configuration of the second lighting in a case in which the light source shape is a polygonal shape.

FIG. 16A is a diagram illustrating a configuration of the first lighting in a case in which the light source shape is a polygonal shape, and FIG. 16B is a diagram illustrating a configuration of the second lighting in the case in which the light source shape is a polygonal shape. A lighting 81A includes a light source 82A having a polygonal shaped lighting region, and a non-lighting region 83A, and a lighting 81B includes a light source 82B having a polygonal shaped lighting region, and a non-lighting region 83B. In this case also, the relationship of the two rotational symmetry with the optical axis center position of the optical system as the symmetry center resides between the light source 82A and the light source 82B. In either cases of using the lightings 71A, 71B or the lightings 81A, 81B, similar effects as the case of using the lightings 1A, 1B can be achieved.

Further, a combination that would satisfy the equation (7) can achieve similar effects as the case of measuring focus by the designed values of the embodiment even without using the designed values (pattern pitch and the like) used in the embodiment.

Figure 17:
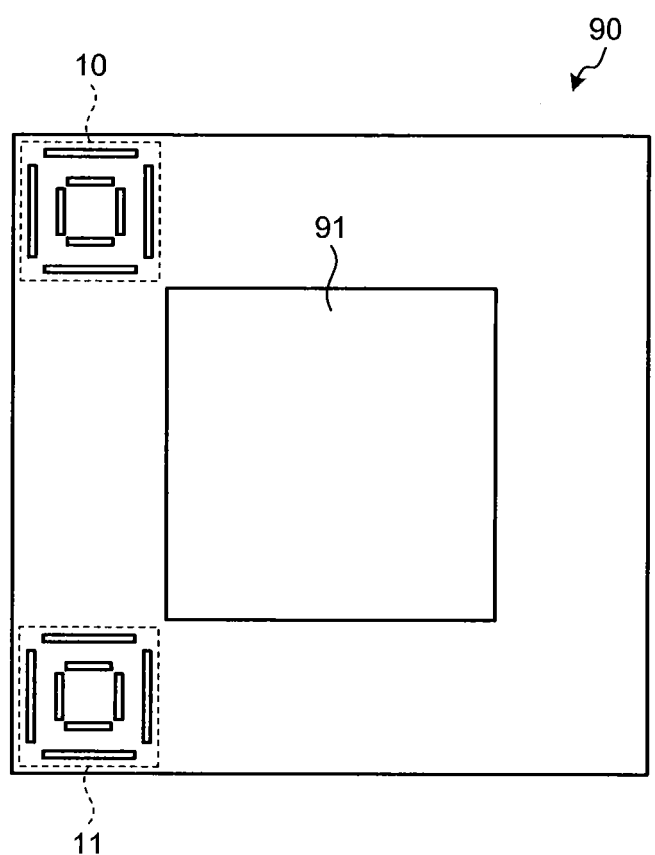
FIG. 17 is a diagram illustrating a configuration of a reticle stage on which inspection marks are formed.

Further, at least one of the inspection marks 10, 11 may be formed on a reticle stage. FIG. 17 is a diagram illustrating a configuration of the reticle stage on which inspection marks are formed. FIG. 17 illustrates a top diagram of the reticle stage.

The reticle stage 90 is configured by including a reticle retaining section 91 that retains the reticle, and a region in which the inspection marks 10, 11 are formed. The reticle retaining section 91 is provided on an inner circumferential section of the reticle stage 90, and the inspection marks 10, 11 are provided at an outer circumferential section of the reticle stage 90. Notably, the inspection marks 10, 11 may be arranged in any region so long as they are in a region other than the reticle retaining section 91.

Figure 18:
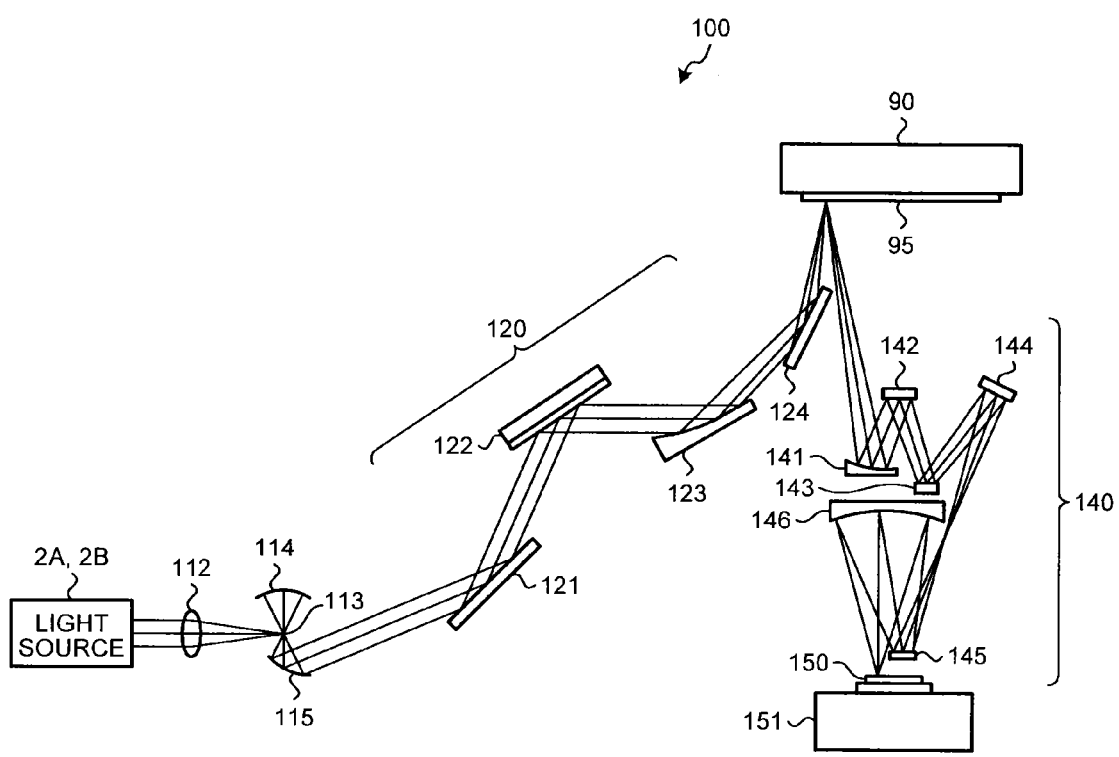
FIG. 18 is a diagram illustrating a configuration of an exposure apparatus of an embodiment.

FIG. 18 is a diagram illustrating a configuration of the exposure apparatus of the embodiment. Notably, in FIG. 18, depiction of the projection lens 20 and the like is omitted. The exposure apparatus 100 is for example a step-and-scan type stepper. The exposure apparatus 100 is provided with light sources 2A, 2B that emit EUV light, a lighting optical system 120 that propagates the light emitted from the light sources 2A, 2B, and a reticle stage 90 on which the light propagated by the lighting optical system 120 is irradiated.

In the case of performing focus measurement, the exposure light is irradiated onto the inspection marks 10, 11 on the reticle stage 90. Further, in a case of performing exposure of a product substrate and the like, the reticle 95 on which a circuit pattern is formed is retained by the reticle retaining section 91. Further, the exposure light is irradiated onto the reticle 95.

In the case where the exposure light is irradiated onto the inspection marks 10, 11, the exposure light is reflected at the inspection marks 10, 11, and in a case where the exposure light is irradiated on the reticle 95, the exposure light is reflected at the reticle 95.

Further, the exposure apparatus 100 includes a projection optical system 140 that propagates the light reflected at the reticle 95, and a wafer stage 151 that is exposed by the light propagated in the projection optical system 140. In the case of performing focus measurement, the wafer 150 for focus measurement is retained by the wafer stage 151. Further, in the case where the exposure to the product substrate is performed, a wafer (not shown) that is the product substrate is retained by the wafer stage 151.

A condenser 112 is arranged at a position adjacent to the light sources 2A, 2B, and condenses the exposure light (laser light) emitted from the light sources 2A, 2B at a focus point 113. The EUV light in a soft X-ray region with a wavelength of 12 nm to 14 nm is discharged from the focus point 113. The discharged EUV light is condensed by an elliptical mirror 114, and is reflected at a parabolic mirror 115.

The lighting optical system 120 that propagates the EUV light reflected at the parabolic mirror 115 includes reflecting mirrors 121, 122, a condenser mirror 123, and an optical path bending mirror 124. The EUV light is reflected at the reflecting mirrors 121, 122, and further is reflected and condensed at the condenser mirror 123. The EUV light having been reflected and condensed at the condenser mirror 123 is reflected at the optical path bending mirror 124. The EUV light having been reflected at the optical path bending mirror 124 reaches the reticle stage 90 or the reticle 95 that is fixed to the reticle stage 90 by electrostatic attaching force.

The projection optical system 140 is arranged below the reticle stage 90. The wafer stage 151 for retaining the wafer 150 and the like is arranged below the projection optical system 140. The projection optical system 140 includes a condenser mirror 141, optical path bending mirrors 142, 143, a condenser mirror 144, an optical path bending mirror 145, and a condenser mirror 146. The EUV light reflected at the reticle stage 90 or the reticle 95 is reflected and condensed at the condenser mirror 141, and is reflected at the optical path bending mirrors 142, 143. Further, the EUV light is reflected and condensed at the condenser mirror 144, and is reflected at the optical path bending mirror 145. The EUV light having been reflected at the optical path bending mirror 145 is condensed and reflected at the condenser mirror 146, and forms a focus on a photosensitive agent (resist film) applied on a surface of the wafer 150 and the like.

In performing the exposure of the product substrate, a focus dislocation amount in the exposure apparatus 100 is predeterminedly measured by using the light sources 2A, 2B and the inspection marks 10, 11 on the reticle stage 90. Then, before performing the exposure of the product substrate, the focus dislocation amount is modified. Thereafter, positioning of the product substrate in a Z direction (direction of an optical axis of the projection optical system) is performed, and then the exposure of the product substrate is performed.

Notably, after the focus measurement is completed, the exposure process for the product substrate and the like may be performed by using the light sources 2A, 2B, or alternatively an exposure of the product substrate and the like using other light sources may be performed. Further, in the case of performing the focus measurement by using the reticle 15 for the focus measurement, the exposure may be performed by using a reticle stage on which the inspection marks 10, 11 are not formed.

The measurement of the focus by the exposure apparatus 100 may be performed at any timing. For example, the focus may be measured for each of layers in the wafer process, and the focus may be measured at a time when the number of exposed product substrates has reached a predetermined number. Further, the focus may be measured each time when a predetermined time elapses.

After the focus has been measured, the exposure process by the exposure apparatus 100 is performed with the focus dislocation amount having been modified. In forming a semiconductor device (semiconductor integrated circuit) on a wafer such as the product substrate, the exposure process is performed on the wafer onto which resist has been applied. Thereafter, the wafer is developed, and a resist pattern is formed on the wafer. Then, a lower layer side of the resist is etched with the resist pattern used as a mask. Due to this, an actual pattern (circuit pattern and the like) corresponding to the resist pattern is formed on the wafer. In manufacturing the semiconductor device, the focus measurement process, the process to modify the focus dislocation amount, the exposure process, the development process, and the etching process and the like as aforementioned are repeated. The focus dislocation amount is modified for example by the exposure apparatus adjusting a strain in the lens, a strain in the mirror, a height of the wafer stage 151 and the like.

Notably, in the embodiment, the case in which the diffraction pattern is a line-and-space pattern has been explained, however, the diffraction pattern may be of any shape. Further, although FIG. 9 explained the case in which the diffracted light satisfies the condition illustrated in FIG. 12A, similar pattern pitch can be achieved even in the case where the diffracted light satisfies the condition illustrated in FIG. 12B.

As above, according to the embodiment, the lighting conditions and the inspection marks 10, 11 are set to satisfy the equation (7), thus it becomes possible to accurately measure the focus position.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of focus measurement comprising:
   projecting first and second line-and-space patterns on a substrate on which a photosensitive material is applied by irradiating first exposure light from a first direction that is displaced from an optical axis of an optical system on the first line-and-space pattern having a first pattern pitch and the second line-and-space pattern having a second pattern pitch;
   projecting third and fourth line-and-space patterns on the substrate by irradiating second exposure light from a second direction that is displaced from the optical axis of the optical system on the third line-and-space pattern having the first pattern pitch and the fourth line-and-space pattern having the second pattern pitch;
   calculating a sum of a dislocated amount on the substrate caused by a dislocation of focus and an overlap dislocation amount on the substrate between the first and third line-and-space patterns as a first dislocation amount by measuring a distance between the first line-and-space pattern and the third line-and-space pattern on the substrate;
   calculating an overlap dislocation amount on the substrate between the second and fourth line-and-space patterns as a second dislocation amount by measuring a distance between the second line-and-space pattern and the fourth line-and-space pattern on the substrate; and
   calculating the focus dislocation amount based on the first and second dislocation amounts.

2. The method of focus measurement according to claim 1, wherein the first exposure light is emitted from a first mono-pole lighting, and the second exposure light is emitted from a second mono-pole lighting.

3. The method of focus measurement according to claim 2, wherein a light source of the first mono-pole lighting and a light source of the second mono-pole lighting have a relationship of a two rotational symmetry with an optical axis center of the optical system as a symmetry axis.

4. The method of focus measurement according to claim 1, wherein the first to fourth line-and-space patterns have a ratio of a line width and a space width at 1:1.

5. The method of focus measurement according to claim 1, wherein the second pattern pitch is half the first pattern pitch.

6. The method of focus measurement according to claim 1, wherein first lighting condition of the first exposure light and second lighting condition of the first exposure light are positions where an irradiated region of diffracted light is inscribed a numerical aperture of a lighting optical system.

7. The method of focus measurement according to claim 1, wherein the third line-and-space pattern is formed such that positive first order diffracted light of the second exposure light matches an optical axis center of a projection lens, and negative first order diffracted light of the second exposure light does not enter within the projection lens.

8. The method of focus measurement according to claim 1, wherein the first to fourth line-and-space patterns are formed on a reticle.

9. The method of focus measurement according to claim 1, wherein the first to fourth line-and-space patterns are formed on a reticle stage.

10. The method of focus measurement according to claim 2, wherein light sources of the first and second mono-pole lightings have a light source shape in a circle shape.

11. A method of manufacturing a semiconductor device, the method comprising:
    projecting first and second line-and-space patterns on a first substrate on which a photosensitive material is applied by irradiating first exposure light from a first direction that is displaced from an optical axis of an optical system on the first line-and-space pattern having a first pattern pitch and the second line-and-space pattern having a second pattern pitch;
    projecting third and fourth line-and-space patterns on the first substrate by irradiating second exposure light from a second direction that is displaced from the optical axis of the optical system on the third line-and-space pattern having the first pattern pitch and the fourth line-and-space pattern having the second pattern pitch;
    calculating a sum of a dislocated amount on the substrate caused by a dislocation of focus and an overlap dislocation amount on the substrate between the first and third line-and-space patterns as a first dislocation amount by measuring a distance between the first line-and-space pattern and the third line-and-space pattern on the first substrate;

calculating an overlap dislocation amount on the substrate between the second and fourth line-and-space patterns as a second dislocation amount by measuring a distance between the second line-and-space pattern and the fourth line-and-space pattern on the first substrate;

calculating the focus dislocation amount based on the first and second dislocation amounts;

modifying the focus dislocation amount;

projecting a circuit pattern on a second substrate on which a photosensitive material is applied by irradiating third exposure light on the circuit pattern formed on a reticle; and forming a resist pattern corresponding to the circuit pattern on the second substrate by developing the second substrate.

12. The method of manufacturing a semiconductor device according to claim 11, wherein the first exposure light is emitted from a first mono-pole lighting, and the second exposure light is emitted from a second mono-pole lighting.

13. The method of manufacturing a semiconductor device according to claim 12, wherein a light source of the first mono-pole lighting and a light source of the second mono-pole lighting have a relationship of a two rotational symmetry with an optical axis center of the optical system as a symmetry axis.

* * * * *